United States Patent
Brüninghoff et al.

(10) Patent No.: US 8,335,243 B2
(45) Date of Patent: Dec. 18, 2012

(54) OPTOELECTRONIC SEMICONDUCTOR BODY AND METHOD FOR PRODUCING AN OPTOELECTRONIC SEMICONDUCTOR BODY

(75) Inventors: Stefanie Brüninghoff, Zeitlarn (DE); Christoph Eichler, Tegernheim (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 126 days.

(21) Appl. No.: 12/866,589

(22) PCT Filed: Feb. 11, 2009

(86) PCT No.: PCT/DE2009/000191
§ 371 (c)(1),
(2), (4) Date: Sep. 15, 2010

(87) PCT Pub. No.: WO2009/103266
PCT Pub. Date: Aug. 27, 2009

(65) Prior Publication Data
US 2011/0013660 A1    Jan. 20, 2011

(30) Foreign Application Priority Data

Feb. 22, 2008 (DE) .......................... 10 2008 010 508
Apr. 9, 2008 (DE) .......................... 10 2008 018 038

(51) Int. Cl.
*H01S 5/00* (2006.01)

(52) U.S. Cl. ................................. 372/46.012; 372/43.01

(58) Field of Classification Search ............. 372/46.012, 372/43.01
See application file for complete search history.

(56) References Cited

U.S. PATENT DOCUMENTS

| | | |
|---|---|---|
| 2005/0277212 A1 | 12/2005 | Kamikawa et al. |
| 2006/0131590 A1 | 6/2006 | Takakura et al. |
| 2006/0166478 A1 | 7/2006 | Sugahara et al. |
| 2007/0051961 A1 | 3/2007 | Kamikawa et al. |
| 2007/0121692 A1* | 5/2007 | Kawakami et al. ......... 372/43.01 |
| 2007/0121695 A1* | 5/2007 | Miyamoto ............... 372/50.124 |
| 2007/0221932 A1 | 9/2007 | Kano et al. |

FOREIGN PATENT DOCUMENTS

DE    10 2008 010 511    8/2009

OTHER PUBLICATIONS

Ito S. et al. "High Power violet laser diodes with crack-free layers on GaN substrates" Phys. Stat. Sol (a) 204, No. 6, (2007) pp. 2073-2076.

\* cited by examiner

*Primary Examiner* — Kinam Park
(74) *Attorney, Agent, or Firm* — Occhiuti Rohlicek & Tsao LLP

(57) ABSTRACT

An optoelectronic semiconductor body comprises a substrate (10), which has on a first main area (12) an epitaxial semiconductor layer sequence (20), suitable for generating electromagnetic radiation, in a first region (14) and a first trench (24) in a second region (22) adjacent to the first region (14), and at least one second trench (30) arranged outside the first region (14). The invention also relates to an optoelectronic semiconductor body and a method for producing an optoelectronic semiconductor body.

12 Claims, 6 Drawing Sheets

Figure 2A:
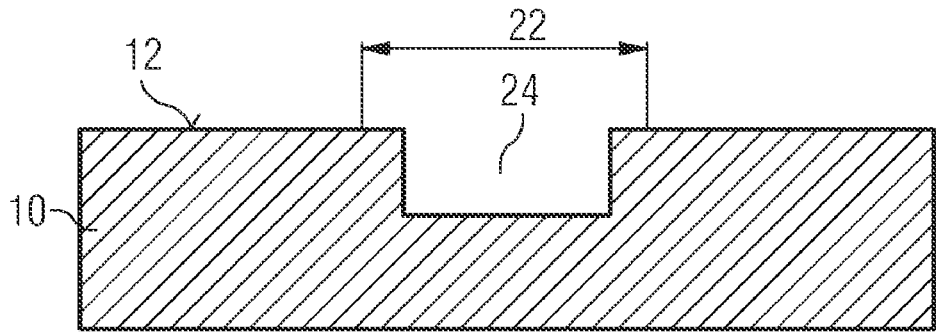

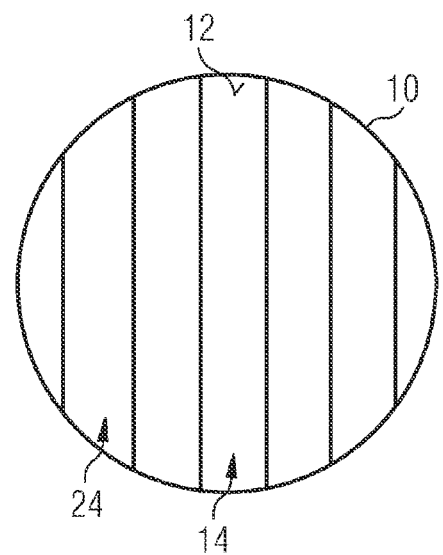
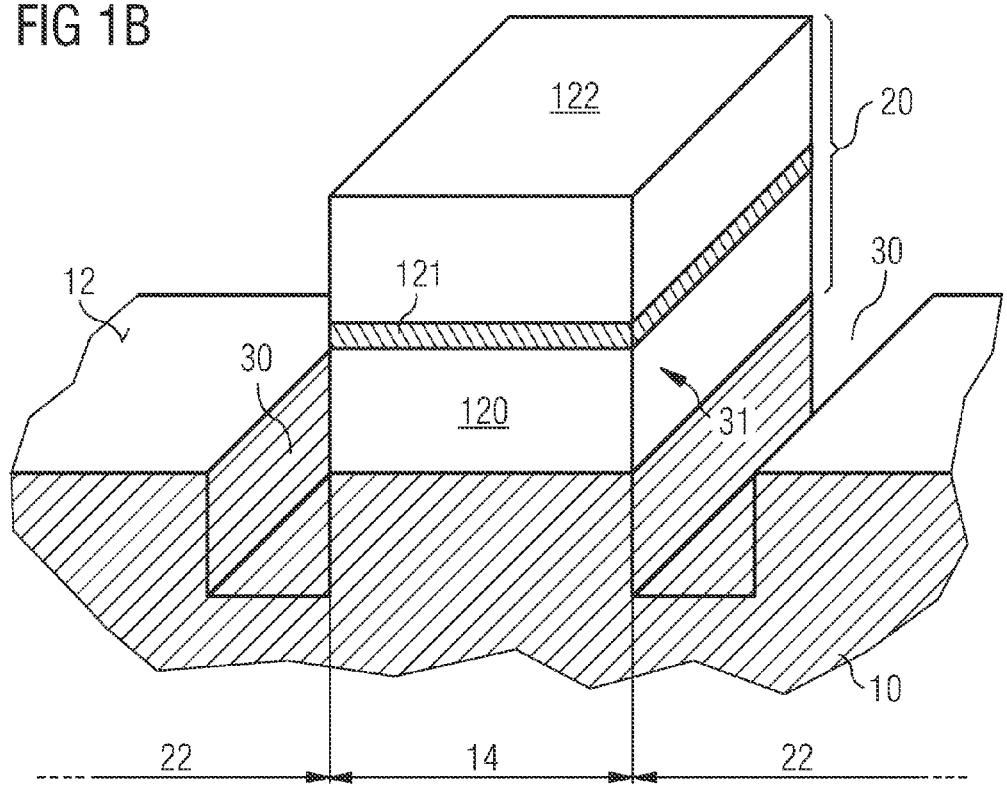

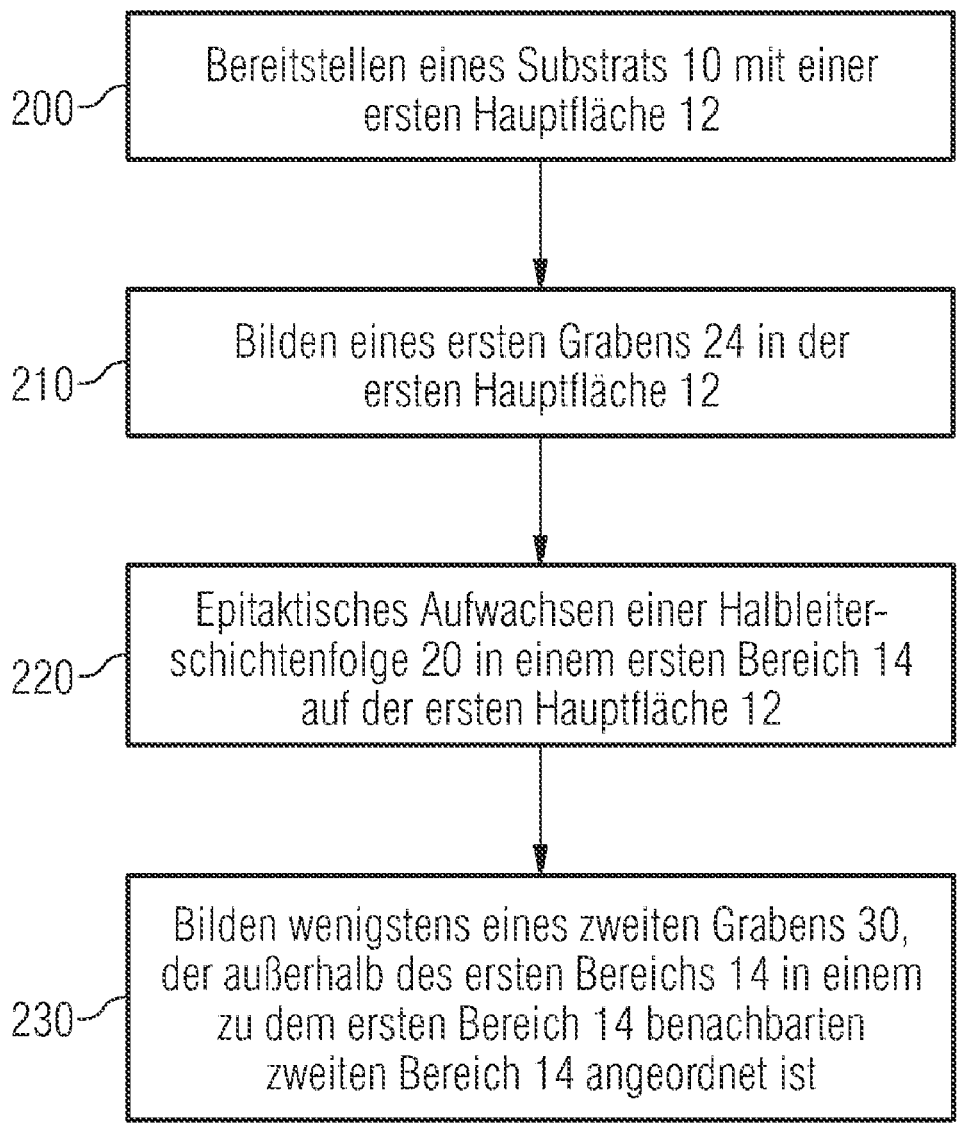

OPTOELECTRONIC SEMICONDUCTOR BODY AND METHOD FOR PRODUCING AN OPTOELECTRONIC SEMICONDUCTOR BODY

CROSS-REFERENCE TO RELATED APPLICATIONS

This application is the National Stage of International Application No. PCT/DE2009/000191 filed Feb. 11, 2009, which claims the priority of German application no. 10 2008 018 038.6, filed Apr. 9, 2008 and German application no. 10 2008 010 508.2, filed Feb. 22, 2008. The contents of each application are hereby incorporated by reference in their entirety.

The present invention relates to an optoelectronic semiconductor body and a method for producing an optoelectronic semiconductor body.

Optoelectronic semiconductor bodies, for generating electromagnetic radiation, are usually produced as a semiconductor layer sequence on a substrate. A semiconductor layer sequence of this type is usually deposited by means of epitaxy on a substrate. In order to produce laser diodes, subsequently n- and p-doped layers with an intervening active region suitable for generating radiation can be applied for example on an n-doped gallium nitride substrate having a small crystal offset. In this case, so-called hetero-epitaxy methods are performed in order to apply different compound semiconductors such as, for example, aluminum gallium nitride or indium gallium nitride on gallium nitride. During the deposition of non-lattice-matched compound semiconductors, mechanical strains can occur between the semiconductor layer sequence and the substrate. Such strains can lead to bending of the substrate or to cracks in the semiconductor layer sequence.

As is described in the article by S. Ito et al., "High power violet laser diodes with crack-free layers on GaN substrates", Phys. Stat. Sol (a) 204, No. 6, 2007, pages 2073-2076, strains can be reduced by a plurality of trenches arranged parallel to one another on the substrate. In this case, before an epitaxial layer is formed, a process for forming a plurality of trenches is carried out, such that the surface of the substrate is conformally covered by a layer after the epitaxial deposition, in which case the trenches are not completely filled, rather only the sidewall thereof is covered. Accordingly, the occurrence of strains and/or cracks is reduced by the presence of a discontinuity in the epitaxial layer.

The object is to provide an improved optoelectronic semiconductor body and to specify a method for producing an improved optoelectronic semiconductor body.

This object is achieved in its first aspect by means of an optoelectronic semiconductor body, comprising a substrate, which has on a first main area an epitaxial semiconductor layer sequence, suitable for generating electromagnetic radiation, in a first region and a first trench in a second region adjacent to the first region, and at least one second trench arranged outside the first region.

Provision is made, for example, for a first trench to be formed on the substrate adjacent to the epitaxial semiconductor layer sequence in the second region, said first trench being suitable for reducing strains during the formation of the epitaxial semiconductor layer sequence. The epitaxial semiconductor layer sequence has a disturbed zone, however, particularly in the region of the sidewalls of the first trench. After the completion of the optoelectronic semiconductor body, these disturbed regions can lead to shunts which can impair the device function. In order to reduce or eliminate these disturbances, at least one second trench arranged adjacent to the epitaxial semiconductor layer sequence is formed. Consequently, discontinuities that occur during the formation of the epitaxial semiconductor layer sequence in the epitaxially applied semiconductor layer sequence cannot cause any disturbances or impair the device function.

In a further embodiment, in the case of the optoelectronic semiconductor body, the second trench is arranged such that the first trench is covered.

In accordance with this embodiment, as a result of a second trench being formed, the epitaxial semiconductor layer sequence is removed in the region of the first trench, such that the disturbed zone lying in the region of the sidewalls of the first trench in the epitaxially applied semiconductor layer sequence cannot cause any disturbances or impair the device function, which zone would be attributable to undefined layer thicknesses or irregular crystal growth of the epitaxial semiconductor layer sequence. After the completion of the optoelectronic semiconductor body, these disturbed regions can lead to shunts which can impair the device function.

In a further embodiment, in the case of the optoelectronic semiconductor body, the second trench is arranged as a separating trench adjacent to the first trench.

In accordance with this embodiment, as a result of a second trench being formed, the epitaxial semiconductor layer sequence is separated from the disturbed zone in the epitaxially applied semiconductor layer sequence which lies in the region of the sidewalls of the first trench, such that said zone cannot cause any disturbances or impair the device function.

In a further embodiment, in the case of the optoelectronic semiconductor body, the second trench is arranged as a separating trench in each case on both sides of the first trench adjacent to the first trench.

In accordance with this embodiment, separation of the disturbed zone of the epitaxially applied semiconductor layer sequence from active regions in both directions is provided, such that disturbances are reduced.

In a further embodiment, in the case of the optoelectronic semiconductor body, a passivation layer is applied on the first main area in the second region, said passivation layer at least partly covering the second trench.

In accordance with this embodiment, in addition to the separation of the disturbed zone of the epitaxial semiconductor layer sequence from active regions, a passivation is provided, which can prevent electrical shunts or creepage currents and also serves for increasing the ESD strength.

Said object is achieved in its second aspect by means of a method for producing an optoelectronic semiconductor body, wherein the following steps are performed:
providing a substrate having a first main area,
forming a first trench in the first main area,
epitaxially growing a semiconductor layer sequence, which has an active layer suitable for generating the electromagnetic radiation, in a first region on the first main area,
forming at least one second trench arranged outside the first region in a second region adjacent to the first region.

Provision is made for forming a first trench on the substrate adjacent to the epitaxial semiconductor layer sequence in the second region, said first trench being suitable for reducing strains during the formation of the epitaxial semiconductor layer sequence. The epitaxial semiconductor layer sequence has a disturbed zone, however, particularly in the region of the sidewalls of the first trench, said zone being attributable to undefined layer thicknesses or irregular crystal growth of the epitaxial semiconductor layer sequence.

After the completion of the optoelectronic semiconductor body, these disturbed regions can lead to shunts which can impair the device function. In order to reduce or eliminate these disturbances, at least one second trench arranged adjacent to the epitaxial semiconductor layer sequence is formed. Consequently, discontinuities that occur during the formation of the epitaxial semiconductor layer sequence in the epitaxially applied semiconductor layer sequence cannot cause any disturbances or impair the device function.

In accordance with at least one embodiment of the method described here and/or of the semiconductor body described here, a semiconductor body is specified wherein the second trench is arranged such that the first trench is covered.

In accordance with at least one embodiment of the method described here and/or of the semiconductor body described here, a semiconductor body is specified wherein the second trench is arranged as a separating trench adjacent to the first trench.

In accordance with at least one embodiment of the method described here and/or of the semiconductor body described here, a semiconductor body is specified wherein the second trench is arranged as a separating trench in each case on both sides of the first trench adjacent to the first trench.

In accordance with at least one embodiment of the method described here and/or of the semiconductor body described here, a semiconductor body is specified wherein a passivation layer is applied on the first main area in the second region, said passivation layer at least partly covering the second trench.

In accordance with at least one embodiment of the method described here and/or of the semiconductor body described here, a semiconductor body is specified wherein the passivation layer furthermore at least partly covers sidewalls of the epitaxial semiconductor layer sequence.

In accordance with at least one embodiment of the method described here and/or of the semiconductor body described here, a semiconductor body is specified wherein the passivation layer at least partly covers sidewalls of the second trench.

In accordance with at least one embodiment of the method described here and/or of the semiconductor body described here, a semiconductor body is specified wherein the passivation layer completely covers the semiconductor body.

In accordance with at least one embodiment of the method described here and/or of the semiconductor body described here, a semiconductor body is specified wherein the passivation layer comprises an oxide, nitride or fluoride compound.

In accordance with at least one embodiment of the method described here and/or of the semiconductor body described here, a semiconductor body is specified wherein the second trench extends from the first main area right into the underlying substrate.

In accordance with at least one embodiment of the method described here and/or of the semiconductor body described here, a semiconductor body is specified wherein the second trench at least partly severs the epitaxial layer sequence from the first main area.

In accordance with at least one embodiment of the method described here and/or of the semiconductor body described here, a semiconductor body is specified wherein the first region comprises a laser or a light-emitting diode.

In accordance with at least one embodiment of the method described here and/or of the semiconductor body described here, a semiconductor body is specified wherein the laser is arranged as a ridge on the first main area of the substrate.

The optoelectronic semiconductor body described here and the method described here for producing an optoelectronic semiconductor body are explained in greater detail below on the basis of a plurality of exemplary embodiments with reference to the figures. Layers, regions and structures that are functionally identical or identical in terms of their effect bear respectively identical reference symbols. Insofar as layers, regions or structures correspond in terms of their function, the description thereof is not repeated in each of the following figures.

Figure 2B:
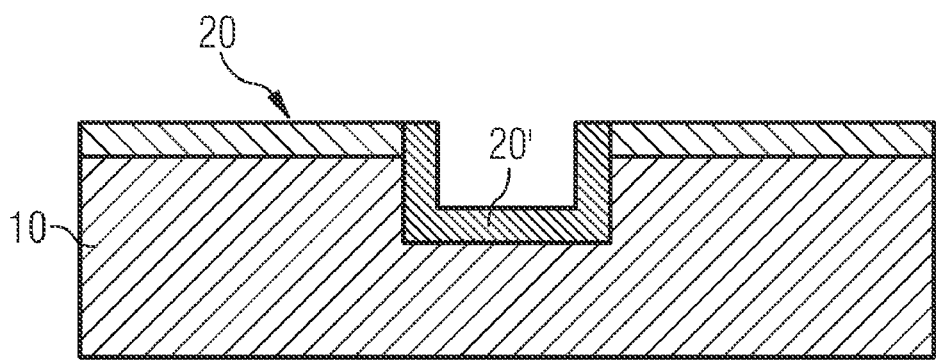
Figure 2C:
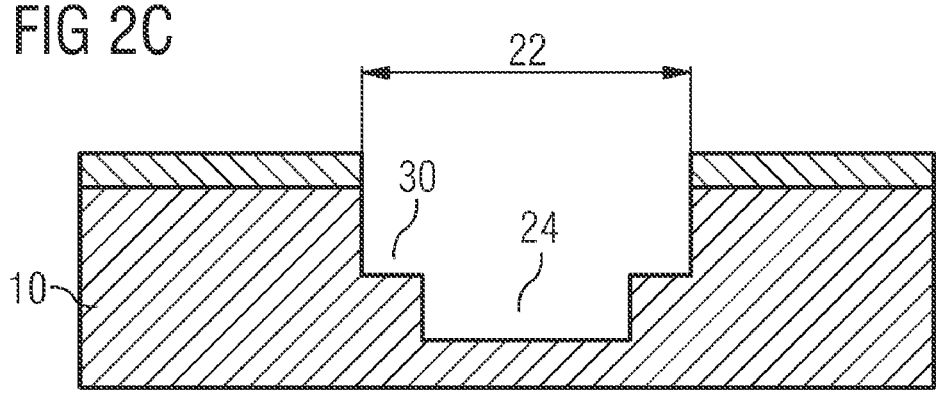
Figure 3A:
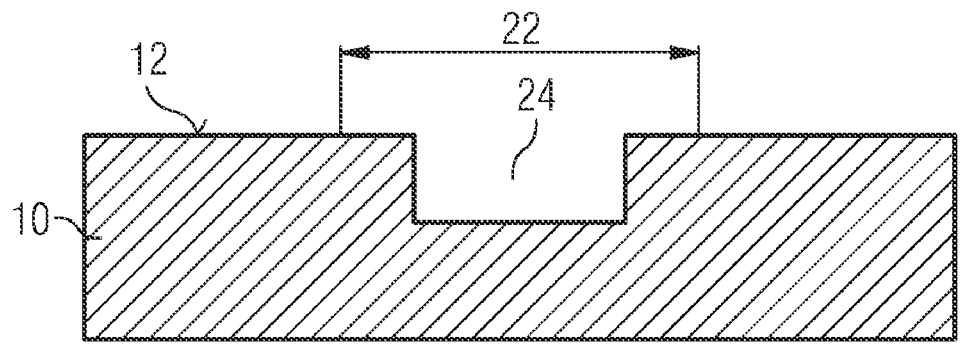
Figure 3B:
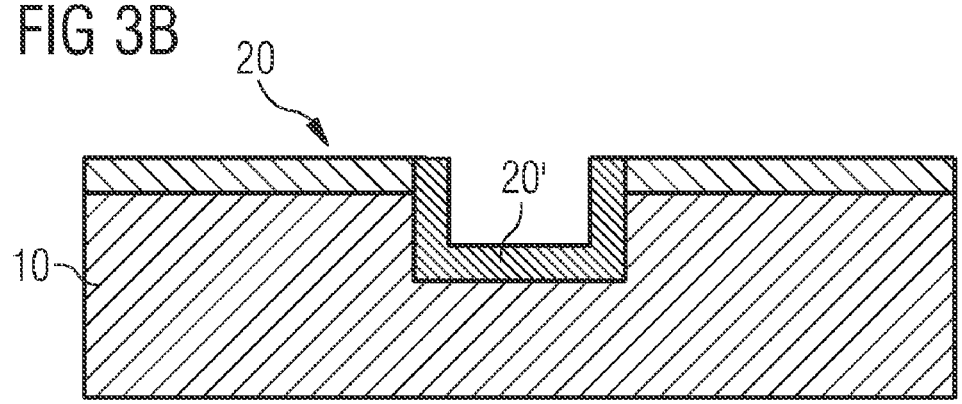
Figure 3C:
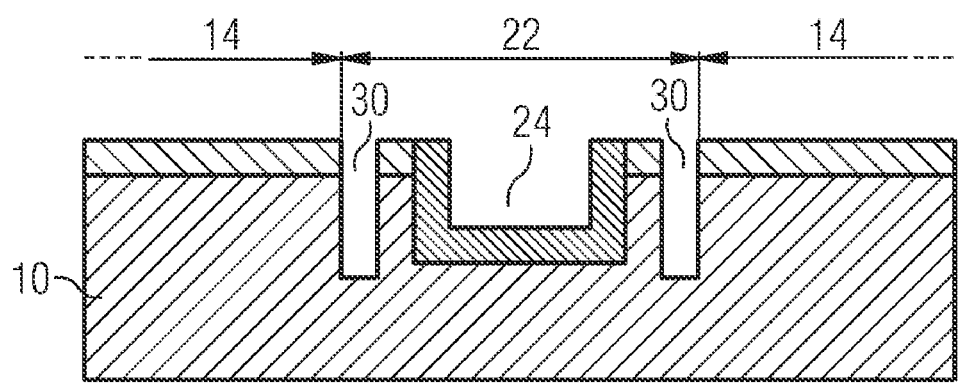
Figure 4A:
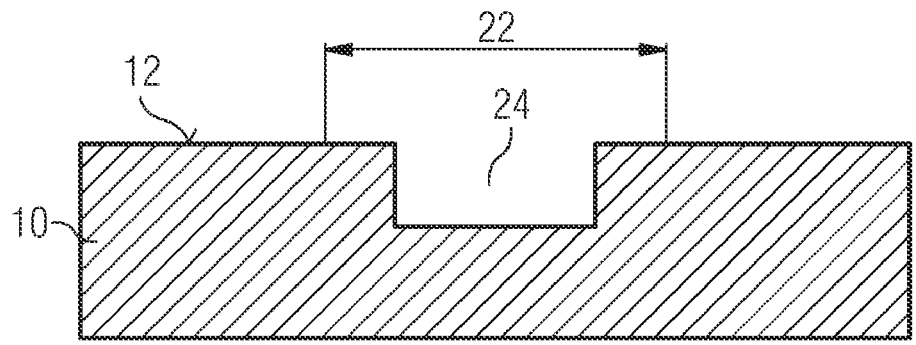
Figure 4B:
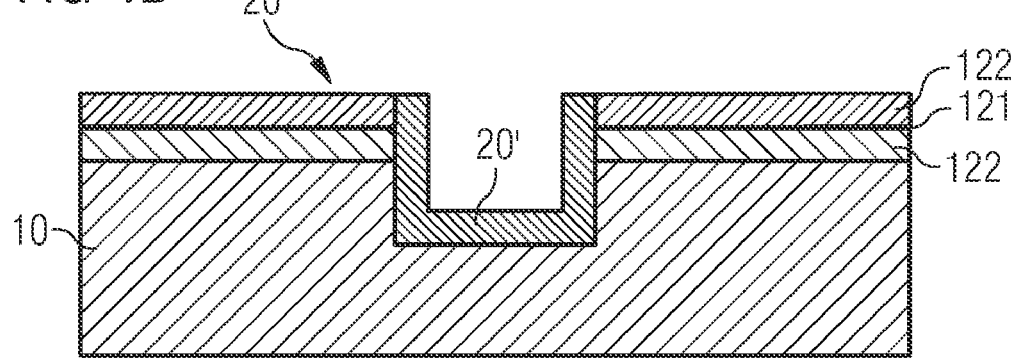
Figure 4C:
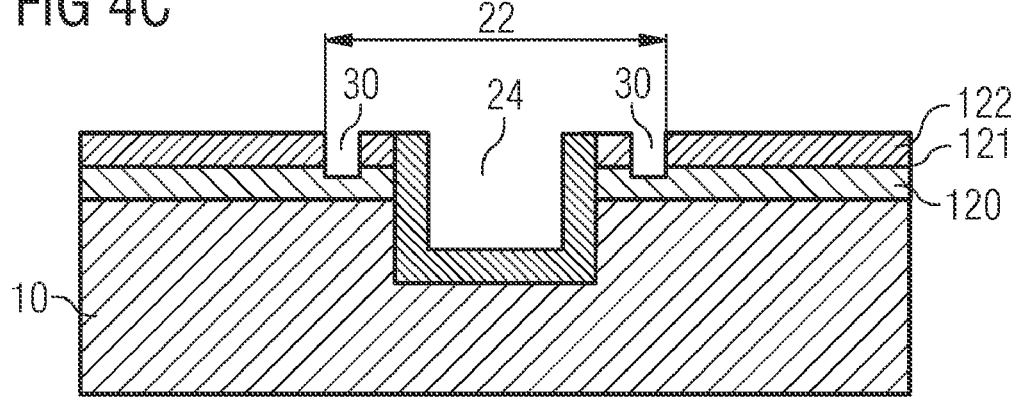
Figure 5:
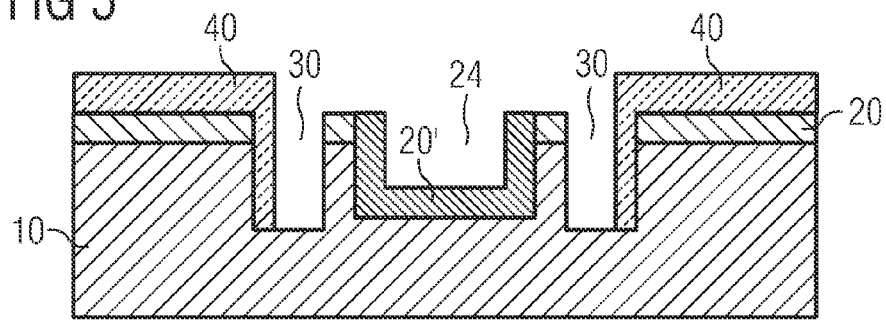
Figure 6:
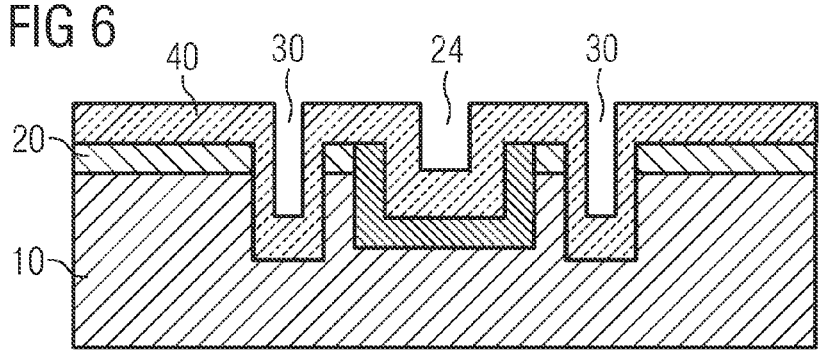
Figure 7:
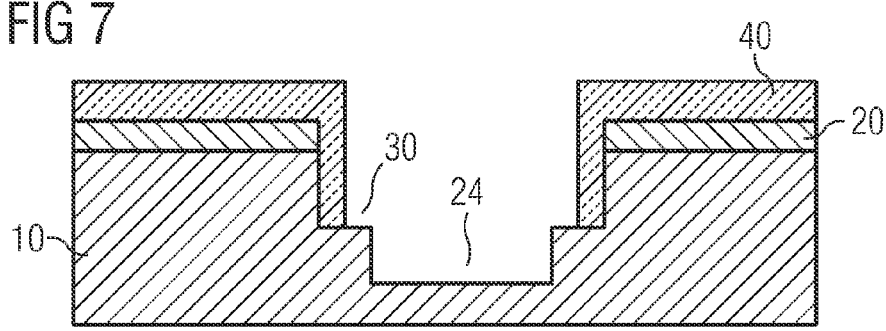
Figure 8:
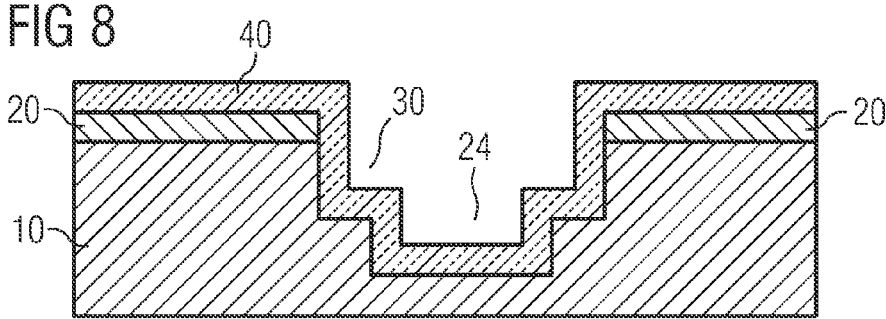

In the figures:

FIG. 1A shows an exemplary embodiment of an optoelectronic semiconductor body in a plan view, FIG. 1B shows an exemplary embodiment of a layer sequence of an optoelectronic semiconductor body in a perspective side view, FIGS. 2A to 2C show by way of example embodiments of a layer sequence of an optoelectronic semiconductor body in a cross-sectional view, FIGS. 3A to 3C show by way of example embodiments of a layer sequence of an optoelectronic semiconductor body in a cross-sectional view, FIGS. 4A to 4C show by way of example embodiments of a layer sequence of an optoelectronic semiconductor body in a cross-sectional view, FIG. 5 shows by way of example an embodiment of a layer sequence of an optoelectronic semiconductor body in a cross-sectional view, FIG. 6 shows by way of example an embodiment of a layer sequence of an optoelectronic semiconductor body in a cross-sectional view, FIG. 7 shows by way of example an embodiment of a layer sequence of an optoelectronic semiconductor body in a cross-sectional view, FIG. 8 shows by way of example an embodiment of a layer sequence of an optoelectronic semiconductor body in a cross-sectional view, and FIG. 9 shows a flowchart of the steps according to the invention of a method for producing an optoelectronic semiconductor body.

FIG. 1A shows an exemplary embodiment of an optoelectronic semiconductor body in a plan view. A semiconductor layer sequence 20 is formed by epitaxial deposition on a substrate 10, for example a semiconductor wafer. Usually, in order to produce a laser diode, an n-conducting substrate 10 composed of gallium nitride with an n-doped layer composed of gallium nitride, an active layer and thereabove a p-doped layer likewise composed of gallium nitride are formed. By way of example, quantum well structures comprising indium gallium nitride are provided as the active layer. Furthermore, in order to increase the device functionality or improve performance, further layers, for example doped connecting layers (so-called "cladding layer"), contact layers or layers for preventing material contaminants (so-called "evaporation preventing layer") can be formed, which are not shown below in order to simplify the illustration of the invention. However, their function is known to the relevant person skilled in the art and it is possible, if appropriate, to implement further measures which can serve for improving the device functionality or performance of a laser diode. Furthermore, a laser diode that has been completely produced comprises on a substrate 10 still further elements such as contact areas or coupling-out elements, for example, which are known to the person skilled in the art, however.

As already mentioned in the introduction, during the deposition of non-lattice-matched compound semiconductors, mechanical strains can occur between the semiconductor layer sequence and the substrate and can lead to bending of the substrate or to cracks in the semiconductor layer sequence.

In order to minimize these effects, as shown in FIG. 1A, a first trench 24 is formed on the substrate 10 on a first main area 12 adjacent to the epitaxial semiconductor layer sequence, said first trench being suitable for reducing strains during the formation of the semiconductor layer sequence in a first region 14. Said first trench 24 can be implemented for example along a crystal orientation of the substrate 10. However, provision is also made for the orientation of the first trench 24 to have any desired direction relative to the crystal orientation of the substrate 10.

For clarification purposes, FIG. 1B shows an excerpt from an exemplary embodiment of a layer sequence of an optoelectronic semiconductor body in a perspective side view. On the substrate 10, the first trench 24 is formed in a second region 22 on the first main area 12 adjacent to the epitaxial semiconductor layer sequence 20, in order to reduce strains during the formation of the semiconductor layer sequence 20 in the first region 14. In this case, the semiconductor layer sequence 20 comprises at least three partial layers 120 to 122 formed, for example, by an n-doped layer 120, an active layer 121 and a p-doped layer 122.

As is shown in FIG. 1B, a second trench 30 is formed in the second region 22 in such a way that the sidewalls 31 facing the epitaxial semiconductor layer sequence 20 are not covered by the epitaxially applied layers. The semiconductor layer sequence 20 would have a disturbed zone, however, during epitaxial growth particularly in the region of sidewalls of the first trench 24, which zone is attributable to undefined layer thicknesses or irregular crystal growth of the epitaxial semiconductor layer sequence 20.

After the completion of the optoelectronic semiconductor body, these disturbed regions can lead to shunts which can impair the device function. In order to reduce or eliminate these disturbances, the second trench 30 is formed, which is arranged adjacent to the epitaxial semiconductor layer sequence 20. Consequently, the discontinuities that occur during the formation of the epitaxial semiconductor layer sequence 20 in the epitaxially applied semiconductor layer sequence cannot cause any disturbances or impair the device function.

Various possibilities for reducing or for preventing discontinuities in the epitaxially applied semiconductor layer sequence 20 are explained below with reference to FIGS. 2 to 4.

FIG. 2A shows, in accordance with a first example, an embodiment of an optoelectronic semiconductor body in a cross-sectional view through a substrate 10 before the semiconductor layer sequence 20 is applied epitaxially. In FIG. 2A, in the second region 22, the first trench 24 has been formed in the substrate 10 for example by means of suitable etching steps using a mask.

As is shown in FIG. 2B, the semiconductor layer sequence 20 is then applied epitaxially. In this case, in a first process step, for example, the n-doped layer 120 is deposited by means of an epitaxy method, for example the MOVPE or MBE methods known in the art, over the whole area on the first main area 12 of the substrate 10. The semiconductor layer sequence 20 can have a disturbed zone during epitaxial growth particularly in the region of sidewalls of the first trench 24, but also at the underside of the trench 24, which zone is attributable to undefined layer thicknesses or irregular crystal growth of the epitaxial semiconductor layer sequence 20. The region of the possibly disturbed zone is identified by the reference symbol 20' in FIG. 2B.

In order to reduce the influences of the discontinuities that possibly occur during the formation of the epitaxial semiconductor layer sequence in the disturbed zone, in accordance with this embodiment provision is made for incorporating a second trench 30 such that the second trench 30 spans the first trench, that is to say has a width that is greater than the width of the first trench 24.

As is shown in FIG. 2C, the epitaxially grown layer 20' is thus removed in the region of sidewalls of the first trench 24 and at the underside of the trench 24. This can be effected for example by means of a second etching step using a suitable mask. Consequently, the region of the disturbed zone is completely removed, such that said region cannot cause any disturbances or impair the device function. Accordingly, the risk of shunts after the completion of the optoelectronic semiconductor body is reduced.

FIG. 3A shows, in a further example, a further embodiment of an optoelectronic semiconductor body in a cross-sectional view through a substrate 10 before the semiconductor layer sequence 20 is applied epitaxially. In FIG. 3A, in the second region 22, the first trench 24 has been formed in the substrate 10 for example by means of suitable etching steps using a mask.

As is shown in FIG. 3B, the semiconductor layer sequence 20 is then applied epitaxially. In this case, in a first process step, for example, the n-doped layer 120 is deposited by means of an epitaxy method over the whole area on the first main area 12 of the substrate 10. The semiconductor layer sequence 20 can have a disturbed zone during epitaxial growth particularly in the region of sidewalls of the first trench 24, but also at the underside of the trench 24, which zone is attributable to undefined layer thicknesses or irregular crystal growth of the epitaxial semiconductor layer sequence 20. The region of the possibly disturbed zone is identified by the reference symbol 20' in FIG. 3B.

As shown in FIG. 3C, in accordance with this embodiment provision is made for incorporating a second trench 30 such that the second trench 30 lies alongside the first trench directly adjacent to the first region 14. In accordance with this embodiment, the second trench is embodied as a separating trench which separates the epitaxially applied layer 20 from the region of the discontinuities in the region of the disturbed zone 20'.

As is shown in FIG. 3C, the epitaxially grown layer 20' remains in the region of sidewalls of the first trench 24 and at the underside of the trench 24. As a result of the formation of the second trench 30, which advantageously severs through the epitaxially applied layer 20 right into the substrate 10, the region of the disturbed zone is electrically insulated from the first region 14, such that the risk of shunts after the completion of the optoelectronic semiconductor body is reduced.

FIG. 4A shows, in a further example, a further embodiment of an optoelectronic semiconductor body in a cross-sectional view through a substrate 10 before the semiconductor layer sequence 20 is applied epitaxially. In FIG. 4A, in the second region 22, the first trench 24 has been formed in the substrate 10 for example by means of suitable etching steps using a mask.

As is shown in FIG. 4B, the semiconductor layer sequence 20 is then applied epitaxially. In this case, in a first process step, for example, the n-doped layer 120 is deposited by means of an epitaxy method over the whole area on the first main area 12 of the substrate 10, in a second process step the active region 121 and in a third process step the p-doped layer 122.

The semiconductor layer sequence 20 can have a disturbed zone during epitaxial growth particularly in the region of sidewalls of the first trench 24, but also at the underside of the trench 24, which zone is attributable to undefined layer thicknesses or irregular crystal growth of the epitaxial semiconductor layer sequence 20. The region of the possibly disturbed zone is identified by the reference symbol 20' again in FIG. 4B.

As shown in FIG. 4C, in accordance with this embodiment provision is made for incorporating a second trench 30 such that the second trench 30 lies alongside the first trench 24 directly adjacent to the first region 14. In accordance with this embodiment, the second trench is embodied as a separating trench which separates the epitaxially applied layer 20 from the region of the discontinuities in the region of the disturbed zone 20'.

As is shown in FIG. 4C, the epitaxially grown layer 20' remains in the region of sidewalls of the first trench 24 and at the underside of the trench 24. As a result of the formation of the second trench 30, which severs at least through the p-doped layer 122 as far as the n-doped layer 120, the region of the disturbed zone is electrically insulated from the first region 14. In accordance with this embodiment, however, it is also possible to form the second trench 30 from the p-doped layer 122 as far as the substrate 10.

A further improvement can be obtained by applying a passivation layer, as is explained below with reference to FIGS. 5 to 8.

FIG. 5 shows an embodiment of a layer sequence of an optoelectronic semiconductor body in a cross-sectional view such as has already been described with reference to FIG. 3C. After the formation of the second trench, a passivation layer 40 is applied, which covers at least the sidewalls of the trench 30 on the side facing the first region.

Accordingly, in addition to the separation of the disturbed zone of the epitaxial semiconductor layer sequence from active regions, a passivation layer 40 is provided, which can prevent electrical shunts or creepage currents and also serves for increasing the ESD strength. The passivation layer 40 can be formed as an oxide, nitride or fluoride layer, for example, although further materials known to the person skilled in the art are not ruled out.

FIG. 6 shows an embodiment of a layer sequence of an optoelectronic semiconductor body in a cross-sectional view such as has already been described with reference to FIG. 3C. After the formation of the second trench, a passivation layer 40 is applied, which, in contrast to FIG. 5, covers the first main area 12 over the whole area. The passivation layer 40 can once again be formed as an oxide, nitride or fluoride layer, although further materials known to the person skilled in the art are not ruled out.

FIG. 7 shows an embodiment of a layer sequence of an optoelectronic semiconductor body in a cross-sectional view such as has already been described with reference to FIG. 4C. After the formation of the second trench, a passivation layer 40 is applied, which covers at least the sidewalls of the trench 30 on the side facing the first region.

Accordingly, in addition to the separation of the disturbed zone of the epitaxial semiconductor layer sequence from active regions, a passivation layer 40 is provided, which can prevent electrical shunts or creepage currents and also serves for increasing the ESD strength. The passivation layer 40 can be formed as an oxide, nitride or fluoride layer, for example, although further materials known to the person skilled in the art are not ruled out.

FIG. 8 shows an embodiment of a layer sequence of an optoelectronic semiconductor body in a cross-sectional view such as has already been described with reference to FIG. 4C. After the formation of the second trench, a passivation layer 40 is applied, which, in contrast to FIG. 7, covers the first main area 12 over the whole area. The passivation layer 40 can once again be formed as an oxide, nitride or fluoride layer, although further materials known to the person skilled in the art are not ruled out.

The method according to the invention is explained in greater detail below with reference to FIG. 9, which shows the individual steps on the basis of a flowchart.

Step 200 involves providing a substrate 10 having a first main area 12.

Step 210 involves forming a first trench 24 in the first main area 12.

Step 220 involves epitaxially growing a semiconductor layer sequence 20, which has an active layer 21 suitable for generating the electromagnetic radiation, in a first region 14 on the first main area 12.

Step 230 involves forming at least one second trench 30 arranged outside the first region 14 in a second region 22 adjacent to the first region 14.

This patent application claims the priority of German patent application DE 102008010508.2 and DE 102008018038.6, the disclosure content of which is hereby incorporated by reference.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor body, comprising
a substrate, which has on a first main area an epitaxial semiconductor layer sequence, suitable for generating electromagnetic radiation, in a first region and a first trench in a second region adjacent to the first region; and
at least one second trench arranged outside the first region, wherein the second trench at least partially severs the epitaxial semiconductor layer sequence from a side of the epitaxial semiconductor layer sequence facing away from the substrate, wherein the second trench completely severs the epitaxial semiconductor layer sequence from the side of the epitaxial semiconductor layer sequence facing away from the substrate and reaches into the substrate.

2. The optoelectronic semiconductor body as claimed in claim 1, wherein the second trench is arranged as a separating trench adjacent to the first trench.

3. The optoelectronic semiconductor body as claimed in claim 2, wherein the second trench is arranged as a separating trench in each case on both sides of the first trench adjacent to the first trench.

4. The optoelectronic semiconductor body as claimed in claim 1, wherein a passivation layer is applied on the first main area in the second region, said passivation layer at least partly covering the second trench.

5. The optoelectronic semiconductor body as claimed in claim 4, wherein the passivation layer furthermore at least partly covers sidewalls of the epitaxial semiconductor layer sequence.

6. The optoelectronic semiconductor body as claimed in claim 4, wherein the passivation layer at least partly covers sidewalls of the second trench.

7. The optoelectronic semiconductor body as claimed in claim 4, wherein the passivation layer comprises an oxide, nitride or fluoride compound.

8. The optoelectronic semiconductor body as claimed in claim 1, wherein the second trench extends from the first main area facing away from the substrate into the underlying substrate.

9. The optoelectronic semiconductor body as claimed in claim 1, wherein the first region comprises a laser or a light-emitting diode.

10. The optoelectronic semiconductor body as claimed in claim 9, wherein the laser is arranged as a ridge on the first main area of the substrate.

11. The optoelectronic semiconductor body as claimed in claim 1, wherein the second trench reaches further into the substrate than the first trench.

12. The optoelectronic semiconductor body as claimed in claim 1, comprising a further second trench wherein the first trench is arranged between the second trench and the further second trench.

* * * * *